United States Patent
Nishimaki et al.

(10) Patent No.: US 8,993,215 B2
(45) Date of Patent: Mar. 31, 2015

(54) RESIST UNDERLAYER FILM FORMING COMPOSITION CONTAINING PHENYLINDOLE-CONTAINING NOVOLAC RESIN

(71) Applicant: Nissan Chemical Industries, Ltd., Tokyo (JP)

(72) Inventors: Hirokazu Nishimaki, Toyama (JP); Rikimaru Sakamoto, Toyama (JP); Keisuke Hashimoto, Toyama (JP); Tetsuya Shinjo, Toyama (JP); Yasunobu Someya, Toyama (JP); Ryo Karasawa, Toyama (JP)

(73) Assignee: Nissan Chemical Industries, Ltd., Tokyo (JP)

(*) Notice: Subject to any disclaimer, the term of this patent is extended or adjusted under 35 U.S.C. 154(b) by 0 days.

(21) Appl. No.: 14/388,074

(22) PCT Filed: Mar. 25, 2013

(86) PCT No.: PCT/JP2013/058557
§ 371 (c)(1),
(2) Date: Sep. 25, 2014

(87) PCT Pub. No.: WO2013/146670
PCT Pub. Date: Oct. 3, 2013

(65) Prior Publication Data
US 2015/0044876 A1    Feb. 12, 2015

(30) Foreign Application Priority Data
Mar. 27, 2012  (JP) ................. 2012-071804

(51) Int. Cl.
*C08G 12/26* (2006.01)
*G03F 7/11* (2006.01)
*H01L 21/027* (2006.01)
*C08G 12/40* (2006.01)
*H01L 21/311* (2006.01)
*G03F 7/09* (2006.01)
*G03F 7/16* (2006.01)
*G03F 7/20* (2006.01)

(52) U.S. Cl.
CPC ............ *H01L 21/0271* (2013.01); *C08G 12/26* (2013.01); *C08G 12/40* (2013.01); *H01L 21/31133* (2013.01); *G03F 7/091* (2013.01); *G03F 7/094* (2013.01); *G03F 7/168* (2013.01); *G03F 7/2037* (2013.01); *G03F 7/2059* (2013.01)
USPC ...................................... 430/270.1

(58) Field of Classification Search
None
See application file for complete search history.

(56) References Cited

U.S. PATENT DOCUMENTS

| 7,378,217 B2 | 5/2008 | Oh et al. |
| 2005/0131167 A1 | 6/2005 | Kaji et al. |
| 2012/0077345 A1 | 3/2012 | Saito et al. |

FOREIGN PATENT DOCUMENTS

| JP | A-1-154050 | 6/1989 |
| JP | A-2-22657 | 1/1990 |
| JP | A-2-293850 | 12/1990 |
| JP | WO 03/068837 A1 | 8/2003 |
| JP | A-2005-128509 | 5/2005 |
| JP | A-2007-178974 | 7/2007 |
| JP | A-2007-199653 | 8/2007 |
| JP | A-2007-297538 | 11/2007 |
| JP | WO 2010/147155 A1 | 12/2010 |

OTHER PUBLICATIONS

Apr. 16, 2013 Translation of Written Opinion issued in International Application No. PCT/JP2013/058557.

*Primary Examiner* — Cynthia Hamilton
(74) *Attorney, Agent, or Firm* — Oliff PLC

(57) ABSTRACT

A composition for forming a resist underlayer film having heat resistance, which is used for a lithography process of semiconductor device production. A resist underlayer film forming composition including a polymer having a unit structure of Formula (1):

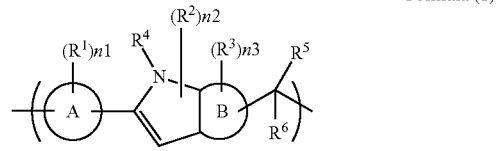

Formula (1)

Preferably, both rings A and B are benzene rings, n1, n2, and n3 are 0, $R^4$ and $R^6$ are hydrogen atoms, or $R^5$ is naphthyl. A method for producing a semiconductor device including: forming an underlayer film by use of the resist underlayer film forming composition onto a semiconductor substrate; forming a hard mask on the underlayer film; forming a resist film on the hard mask; forming a resist pattern by irradiation with light or an electron beam and development; etching the hard mask using the resist pattern; etching the underlayer film by use of the patterned hard mask; and processing the semiconductor substrate by use of the patterned underlayer film.

8 Claims, 3 Drawing Sheets

RESIST UNDERLAYER FILM FORMING COMPOSITION CONTAINING PHENYLINDOLE-CONTAINING NOVOLAC RESIN

TECHNICAL FIELD

The present invention relates to a resist underlayer film forming composition for lithography that is effective at the time of semiconductor substrate processing, a method for forming a resist pattern using the resist underlayer film forming composition, and a method for producing a semiconductor device.

BACKGROUND ART

Conventionally, microfabrication has been carried out by lithography using a photoresist composition in production of semiconductor devices. The microfabrication is a machining process in which a thin film of a photoresist composition is formed on a substrate to be processed, such as a silicon wafer, the film is irradiated with an active light such as ultraviolet light through a mask pattern in which a pattern of a semiconductor device is depicted, the pattern is developed, and the substrate to be processed, such as a silicon wafer, is etched using the obtained photoresist pattern as a protective film. In recent years, however, semiconductor devices have been further integrated, and the active light to be used has been shifted to a shorter wavelength, from a KrF excimer laser (248 nm) to an ArF excimer laser (193 nm). This raises serious difficulties due to the effects of diffuse reflections of active light from a substrate and standing waves. Therefore, a method for providing an anti-reflective coating (Bottom Anti-Reflective Coating, BARC) between the photoresist and the substrate to be processed has been widely studied.

Hereafter, when formation of finer resist pattern progresses, an issue of resolution and an issue of resist pattern collapse after development arise and thus thinner resist film formation is desired. Therefore, it is difficult to obtain a sufficient resist pattern film thickness in substrate processing. As a result, a process has been required in which not only the resist pattern but also a resist underlayer film formed between the resist and the semiconductor substrate to be processed have a function as a mask at the time of the substrate processing. As a resist underlayer film for the process as described above, different from a conventional high etch rate (etching rate is fast) resist underlayer film, the following resist underlayer films have been required: a resist underlayer film for lithography having a selectivity of a dry etching rate close to that of a resist, a resist underlayer film for lithography having a selectivity of the dry etching rate smaller than that of a resist, and a resist underlayer film for lithography having a selectivity of the dry etching rate smaller than that of a semiconductor substrate.

As polymers for the resist underlayer film, for example, the following polymers are exemplified.

A resist underlayer film forming composition using polyvinyl carbazole is exemplified (refer to Patent Document 1, Patent Document 2, and Patent Document 3).

A resist underlayer film forming composition using a fluorenephenol novolac resin is disclosed (refer to Patent Document 4, etc.).

A resist underlayer film forming composition using a fluorenenaphthol novolac resin is disclosed (refer to Patent Document 5, etc.).

A resist underlayer film forming composition containing a resin in which fluorenephenol and arylalkylene are repeating units is disclosed (refer to Patent Document 6, Patent Document 7, etc.).

PRIOR ART DOCUMENTS

Patent Documents

Patent Document 1: Japanese Patent Application Publication No. H2-293850 (JP H2-293850 A)
Patent Document 2: Japanese Patent Application Publication No. H1-154050 (JP H1-154050 A)
Patent Document 3: Japanese Patent Application Publication No. H2-22657 (JP H2-22657 A)
Patent Document 4: Japanese Patent Application Publication No. 2005-128509 (JP 2005-128509 A)
Patent Document 5: Japanese Patent Application Publication No. 2007-199653 (JP 2007-199653 A)
Patent Document 6: Japanese Patent Application Publication No. 2007-178974 (JP 2007-178974 A)
Patent Document 7: U.S. Pat. No. 7,378,217

SUMMARY OF THE INVENTION

Problem to be Solved by the Invention

An object of the present invention is to provide a resist underlayer film forming composition used for a lithography process of semiconductor device production. Another object of the present invention is to provide a resist underlayer film for lithography that does not cause intermixing with a resist layer, can obtain an excellent resist pattern, and has a selectivity of a dry etching rate close to that of the resist, a resist underlayer film for lithography having a selectivity of the dry etching rate smaller than that of a resist, and a resist underlayer film for lithography having a selectivity of the dry etching rate smaller than that of a semiconductor substrate. The present invention may also provide a function to effectively absorb light reflected from the substrate when irradiation light having wavelengths such as 248 nm, 193 nm, and 157 nm is used for microfabrication. Further, another object of the present invention is to provide a method for forming a resist pattern using the resist underlayer film forming composition. Still another object of the present invention is to provide a resist underlayer film forming composition for forming a resist underlayer film that additionally has heat resistance.

Means for Solving the Problem

The present invention provides, as a first aspect, a resist underlayer film forming composition comprising: a polymer having a unit structure of Formula (1):

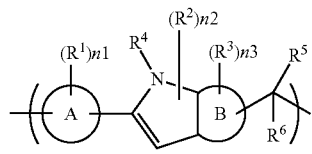

Formula (1)

(where $R^1$, $R^2$, and $R^3$ are substituents of hydrogen atoms on rings and are each independently a halogen group, a nitro group, an amino group, a hydroxy group, a $C_{1-10}$ alkyl group, a $C_{2-10}$ alkenyl group, a $C_{6-40}$ aryl group, or a combination of any of these groups that optionally includes an ether bond, a ketone bond, or an ester bond; $R^4$ is a hydrogen atom, a $C_{1-10}$ alkyl group, a $C_{2-10}$ alkenyl group, a $C_{6-40}$ aryl group, or a combination of any of these groups that optionally includes an ether bond, a ketone bond, or an ester bond; $R^5$ is a hydrogen atom, or a $C_{6-40}$ aryl group or a heterocyclic group that is optionally substituted with a halogen group, a nitro group, an amino group, a formyl group, a carboxy group, a carboxylic acid alkyl ester group, a phenyl group, a $C_{1-10}$ alkoxy group, or a hydroxy group; $R^6$ is a hydrogen atom, or a $C_{1-10}$ alkyl group, a $C_{6-40}$ aryl group, or a heterocyclic group that is optionally substituted with a halogen group, a nitro group, an amino group, a formyl group, a carboxy group, a carboxylic acid alkyl ester group, or a hydroxy group, or $R^5$ and $R^6$ optionally form a ring together with a carbon atom bonding to $R^5$ and $R^6$; a ring A and a ring B each are a benzene ring, a naphthalene ring, or an anthracene ring; n1, n2, and n3 each are an integer of 0 or more and up to a maximum number of substituents being able to be substituted in the ring);

as a second aspect, the resist underlayer film forming composition according to the first aspect, in which both of the ring A and the ring B are benzene rings, n1, n2, and n3 are each 0, and $R^4$ is a hydrogen atom;

as a third aspect, the resist underlayer film forming composition according to the first aspect or the second aspect, in which $R^5$ is a hydrogen atom, or a phenyl group, a naphthyl group, an anthryl group, or a pyrenyl group that is optionally substituted with a halogen group, a nitro group, an amino group, a formyl group, a carboxy group, a carboxylic acid alkyl ester group, a phenyl group, a $C_{1-10}$ alkoxy group, or a hydroxy group, and $R^6$ is a hydrogen atom;

as a fourth aspect, the resist underlayer film forming composition according to any one of the first aspect to the third aspect, further comprising a crosslinking agent;

as a fifth aspect, the resist underlayer film forming composition according to any one of the first aspect to the fourth aspect, further comprising an acid and/or an acid generator;

as a sixth aspect, a resist underlayer film obtained by applying the resist underlayer film forming composition as described in any one of the first aspect to the fifth aspect onto a semiconductor substrate and baking the composition;

as a seventh aspect, a method for producing a semiconductor device, the method comprising: forming an underlayer film by use of the resist underlayer film forming composition as described in any one of the first aspect to the fifth aspect onto a semiconductor substrate; forming a resist film on the underlayer film; forming a resist pattern by irradiation with light or an electron beam and development; etching the underlayer film by use of the resist pattern; and processing the semiconductor substrate by use of the patterned underlayer film; and as an eighth aspect, a method for producing a semiconductor device, the method comprising: forming an underlayer film by use of the resist underlayer film forming composition as described in any one of the first aspect to the fifth aspect onto a semiconductor substrate; forming a hard mask on the underlayer film; forming a resist film on the hard mask; forming a resist pattern by irradiation with light or an electron beam and development; etching the hard mask by use of the resist pattern; etching the underlayer film by use of the patterned hard mask; and processing the semiconductor substrate by use of the patterned underlayer film.

Effects of the Invention

By the use of the resist underlayer film forming composition of the present invention, an excellent resist pattern shape can be formed without causing intermixing between un upper layer of the resist underlayer film and a layer covering the upper layer.

The resist underlayer film forming composition of the present invention can also provide a function with which reflection from a substrate can be effectively reduced and thus can also have an effect as an anti-reflective coating of exposure light.

The use of the resist underlayer film forming composition of the present invention can provide an excellent resist underlayer film having a selectivity of the dry an etching rate close to that of the resist, a selectivity of the dry etching rate smaller than that of the resist, or a selectivity of the dry etching rate smaller than that of the semiconductor substrate.

With formation of a finer resist pattern, a thinner resist film is formed in order to prevent the resist pattern from collapse after development. For forming the thin resist film described above, a process including the steps of transferring a resist pattern to an underlayer film by an etching process and processing a substrate using the underlayer film as a mask and a process including the steps of transferring a resist pattern to an underlayer film by etching process; transferring the pattern transferred to the underlayer film to an underlayer film of the underlayer film using a different gas composition; repeating these steps; and finally processing a substrate are exemplified. The resist underlayer film of the present invention and the forming composition of the resist underlayer film are useful to these processes. When the substrate is processed using the resist underlayer film of the present invention, the resist underlayer film has sufficient etching resistance to a processing substrate (for example, a thermally oxidized silicon film, a silicon nitride film, or a polysilicon film on a substrate).

The resist underlayer film of the present invention can be used as a planarizing film, a resist underlayer film, a contamination prevention film of the resist layer, and a film having a dry etching selectivity. This can easily and precisely form a resist pattern in a lithography process of semiconductor production.

A following process can be exemplified. The process includes the steps of: forming an underlayer film by use of the resist underlayer film forming composition according to the present invention onto a semiconductor substrate; forming a hard mask on the underlayer film; forming a resist film on the hard mask; forming a resist pattern by irradiation with exposure and development; transferring the resist pattern to the hard mask; transferring the resist pattern transferred to the hard mask to the resist underlayer film; and processing the semiconductor substrate by use of the underlayer film. In this process, the hard mask is formed by use of an application type composition including an organic polymer or an inorganic polymer and a solvent or formed by vacuum vapor deposition of an inorganic substance. In the vacuum vapor deposition of the inorganic substance (for example, silicon oxynitride), the vapor deposited substance is deposited on the surface of the resist underlayer film. At this time, a temperature at the surface of the resist underlayer film rises to about 400° C. In the present invention, the used polymer is the polymer having the unit structure of Formula (1) and therefore the polymer has extremely high heat resistance and does not cause thermal degradation by the deposition of the vapor deposited substance.

MODES FOR CARRYING OUT THE INVENTION

Figure 1:
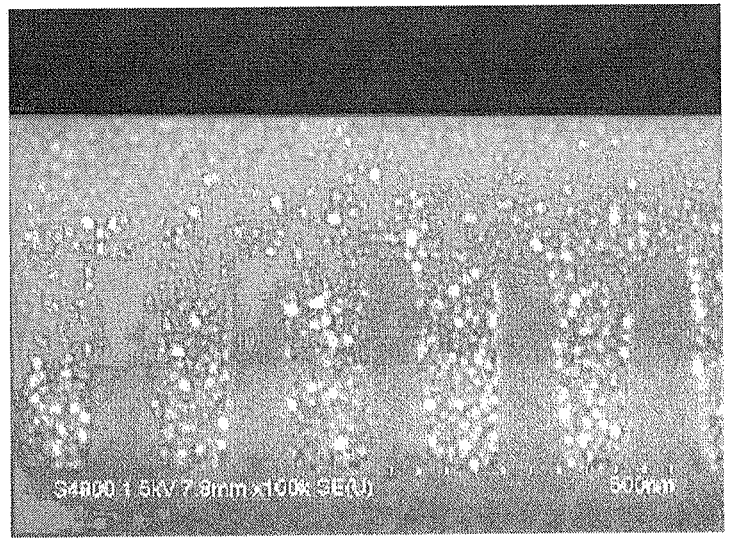
FIG. 1 is a photograph of a cross section of an upper surface part of a substrate which is formed by applying a solution of a resist underlayer film forming composition prepared in Example 1 onto a hole wafer substrate using a spin coater and baking the coating at 400° C. for 2 minutes and is observed by an electron microscope (100,000 magnifications).
Figure 2:
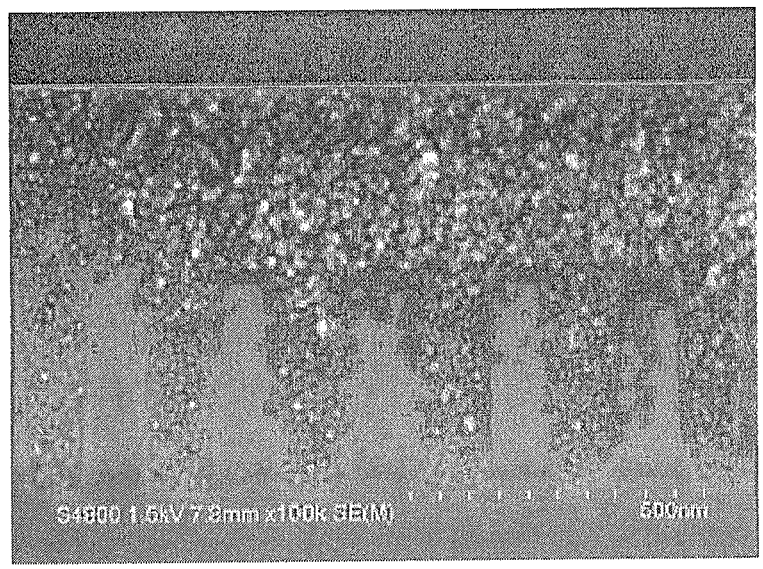
FIG. 2 is a photograph of a cross section of an upper surface part of a substrate which is formed by applying a solution of a resist underlayer film forming composition prepared in Example 2 onto a hole wafer substrate using a spin coater and baking the coating at 400° C. for 2 minutes and is observed by an electron microscope (100,000 magnifications).
Figure 3:
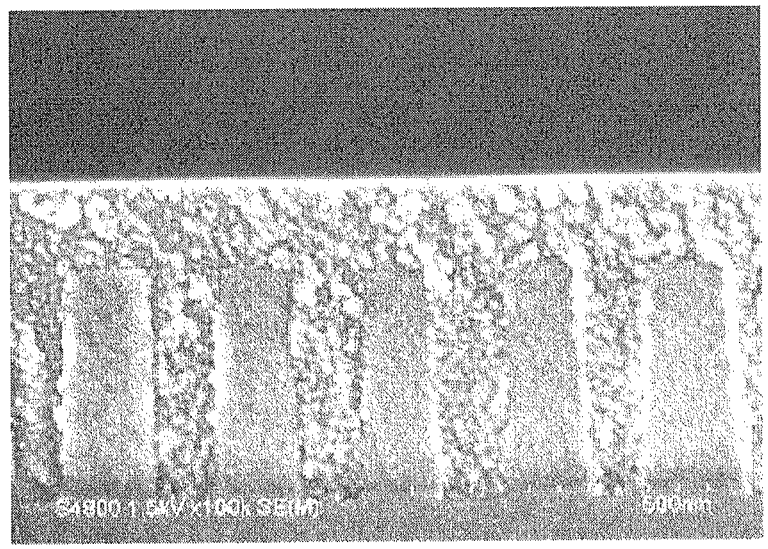
FIG. 3 is a photograph of a cross section of an upper surface part of a substrate which is formed by applying a solution of a resist underlayer film forming composition prepared in Example 3 onto a hole wafer substrate using a spin coater and baking the coating at 400° C. for 2 minutes and is observed by an electron microscope (100,000 magnifications).
Figure 4:
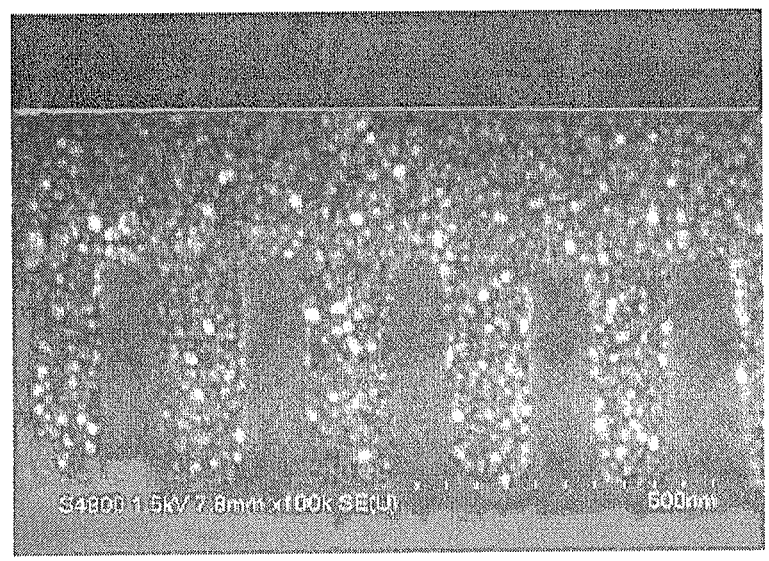
FIG. 4 is a photograph of a cross section of an upper surface part of a substrate which is formed by applying a solution of a resist underlayer film forming composition prepared in Example 4 onto a hole wafer substrate using a spin coater and baking the coating at 400° C. for 2 minutes and is observed by an electron microscope (100,000 magnifications).

The present invention includes a resist underlayer film forming composition comprising a polymer having a unit structure of Formula (1).

In the present invention, the resist underlayer film forming composition for lithography includes the polymer and a solvent. The resist underlayer film forming composition can further comprises a crosslinking agent and an acid, and can optionally include additives such as an acid generator and a surfactant. A solid content of the composition is 0.1% by mass to 70% by mass or 0.1% by mass to 60% by mass. The solid content is a content ratio of the total component of the resist underlayer film forming composition from which the solvent is removed. In the solid content, the polymer can be included in a ratio of 1% by mass to 100% by mass, or 1% by mass to 99.9% by mass, or 50% by mass to 99.9% by mass, or 50% by mass to 95% by mass, or 50% by mass to 90% by mass.

The polymer used in the present invention has a weight average molecular weight of 600 to 1,000,000 or 600 to 200,000.

In Formula (1), $R^1$, $R^2$, and $R^3$ are substituents of hydrogen atoms in a ring and are each independently a halogen group, a nitro group, an amino group, a hydroxy group, a $C_{1-10}$ alkyl group, a $C_{2-10}$ alkenyl group, a $C_{6-40}$ aryl group, or a combination thereof that optionally includes an ether bond, a ketone bond, or an ester bond. $R^4$ is a hydrogen atom, a $C_{1-10}$ alkyl group, a $C_{2-10}$ alkenyl group, a $C_{6-40}$ aryl group, or a combination thereof that optionally includes an ether bond, a ketone bond, or an ester bond. $R^5$ is a hydrogen atom, or a $C_{6-40}$ aryl group or a heterocyclic group that is optionally substituted with a halogen group, a nitro group, an amino group, a formyl group, a carboxy group, an carboxylic acid alkyl ester group, a phenyl group, a $C_{1-10}$ alkyl group, or a hydroxy group, and $R^6$ is a hydrogen atom, or a $C_{1-10}$ alkyl group, a $C_{6-40}$ aryl group, or a heterocyclic group that is optionally substituted with a halogen group, a nitro group, an amino group, a formyl group, a carboxy group, a carboxylic acid alkyl ester group, or a hydroxy group, or $R^5$ and $R^6$ optionally form a ring together with a carbon atom bonding to $R^5$ and $R^6$. A ring A and a ring B each are a benzene ring, a naphthalene ring, or an anthracene ring. n1, n2, and n3 each are an integer of 0 or more and up to a maximum number of substituents being able to be substituted in the ring.

The alkyl group in the carboxylic acid alkyl ester group includes a $C_{1-10}$ alkyl group.

Examples of the $C_{1-10}$ alkyl group may include a methyl group, an ethyl group, an n-propyl group, an i-propyl group, a cyclopropyl group, an n-butyl group, an i-butyl, an s-butyl group, a t-butyl group, a cyclobutyl group, a 1-methyl-cyclopropyl group, a 2-methyl-cyclopropyl group, an n-pentyl group, an 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl-group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclopropyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

Examples of the $C_{2-10}$ alkenyl group may include an ethenyl group, a 1-propenyl group, a 2-propenyl group, a 1-methyl-1-ethenyl group, a 1-butenyl group, a 2-butenyl group, a 3-butenyl group, a 2-methyl-1-propenyl group, a 2-methyl-2-propenyl group, a 1-ethylethenyl group, a 1-methyl-1-propenyl group, a 1-methyl-2-propenyl group, a 1-pentenyl group, a 2-pentenyl group, a 3-pentenyl group, a 4-pentenyl group, a 1-n-propylethenyl group, a 1-methyl-1-butenyl group, a 1-methyl-2-butenyl group, a 1-methyl-3-butenyl group, a 2-ethyl-2-propenyl group, a 2-methyl-1-butenyl group, a 2-methyl-2-butenyl group, a 2-methyl-3-butenyl group, a 3-methyl-1-butenyl group, a 3-methyl-2-butenyl group, a 3-methyl-3-butenyl group, a 1,1-dimethyl-2-propenyl group, a 1-i-propylethenyl group, a 1,2-dimethyl-1-propenyl group, a 1,2-dimethyl-2-propenyl group, a 1-cyclopentenyl group, a 2-cyclopentenyl group, a 3-cyclopentenyl group, a 1-hexenyl group, a 2-hexenyl group, a 3-hexenyl group, a 4-hexenyl group, a 5-hexenyl group, a 1-methyl-1-pentenyl group, a 1-methyl-2-pentenyl group, a 1-methyl-3-pentenyl group, a 1-methyl-4-pentenyl group, a 1-n-butylethenyl group, a 2-methyl-1-pentenyl group, a 2-methyl-2-pentenyl group, a 2-methyl-3-pentenyl group, a 2-methyl-4-pentenyl group, a 2-n-propyl-2-propenyl group, a 3-methyl-1-pentenyl group, a 3-methyl-2-pentenyl group, a 3-methyl-3-pentenyl group, a 3-methyl-4-pentenyl group, a 3-ethyl-3-butenyl group, a 4-methyl-1-pentenyl group, a 4-methyl-2-pentenyl group, a 4-methyl-3-pentenyl group, a 4-methyl-4-pentenyl group, a 1,1-dimethyl-2-butenyl group, a 1,1-dimethyl-3-butenyl group, a 1,2-dimethyl-1-butenyl group, a 1,2-dimethyl-2-butenyl group, a 1,2-dimethyl-3-butenyl group, a 1-methyl-2-ethyl-2-propenyl group, a 1-s-butylethenyl group, a 1,3-dimethyl-1-butenyl group, a 1,3-dimethyl-2-butenyl group, a 1,3-dimethyl-3-butenyl group, a 1-i-butylethenyl group, a 2,2-dimethyl-3-butenyl group, a 2,3-dimethyl-1-butenyl group, a 2,3-dimethyl-2-butenyl group, a 2,3-dimethyl-3-butenyl group, a 2-i-propyl-2-propenyl group, a 3,3-dimethyl-1-butenyl group, a 1-ethyl-1-butenyl group, a 1-ethyl-2-butenyl group, a 1-ethyl-3-butenyl group, a 1-n-propyl-1-propenyl group, a 1-n-propyl-2-propenyl group, a 2-ethyl-1-butenyl group, a 2-ethyl-2-butenyl group, a 2-ethyl-3-butenyl group, a 1,1,2-trimethyl-2-propenyl group, a 1-t-butylethenyl group, a 1-methyl-1-ethyl-2-propenyl group, a 1-ethyl-2-methyl-1-propenyl group, a 1-ethyl-2-methyl-2-propenyl group, a 1-i-propyl-1-propenyl group, a 1-i-propyl-2-propenyl group, a 1-methyl-2-cyclopentenyl group, a 1-methyl-3-cyclopentenyl group a 2-methyl-1-cyclopentenyl group a 2-methyl-2-cyclopentenyl group a 2-methyl-3-cyclopentenyl group a 2-methyl-4-cyclopentenyl group a 2-methyl-5-cyclopentenyl group, a 2-methylene-cyclopentyl group, a 3-methyl-1-cyclopentenyl group, a 3-methyl-2-cyclopentenyl group, a 3-methyl-3-cyclopentenyl group, a 3-methyl-4-cyclopentenyl group, a 3-methyl-5-cyclopentenyl group, a 3-methylene-cyclopentyl group, a 1-cyclohexenyl group, a 2-cyclohexenyl group, and a 3-cyclohexenyl group.

Examples of the $C_{1-10}$ alkoxy may include a methoxy group, an ethoxy group, an n-propoxy group, an i-propoxy group, an n-butoxy, an i-butoxy, an s-butoxy, a t-butoxy group, an n-pentyloxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, an n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy, a 3,3-dimethyl-n-butoxy group, a 1-ethyl-n-butoxy group, a 2-ethyl-n-butoxy group, a 1,1,2-trimethyl-n-propoxy group, a 1,2,2-trimethyl-n-propoxy group, a 1-ethyl-1-methyl-n-propoxy group, and a 1-ethyl-2-methyl-n-propoxy group.

Examples of the $C_{6-40}$ aryl group may include a phenyl group, an o-methylphenyl group, an m-methylphenyl group, a p-methylphenyl group, an o-chlorophenyl group, an m-chlorophenyl group, a p-chlorophenyl group, an o-fluorophenyl group, a p-fluorophenyl group, an o-methoxyphenyl group, a p-methoxyphenyl group, a p-nitrophenyl group, a p-cyanophenyl group, an α-naphthyl, a β-naphthyl group, an o-biphenylyl group, an m-biphenylyl group, a p-biphenylyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, and a 1-pyrenyl group.

As the heterocyclic group, an organic group made of a heterocyclic ring of 5-membered ring or 6-membered ring containing nitrogen, sulfur, or oxygen is preferable. Examples of the heterocyclic group may include a pyrrole group, a furan group, a thiophene group, an imidazole group, an oxazole group, a thiazole group, a pyrazole group, an isoxazole group, an isothiazole group, and a pyridine group.

Examples of the $C_{6-40}$ aryl group substituted with a hydroxy group or hydroxy groups may include a group derived from phenol, dihydroxybenzene, trihydroxybenzene, naphthol, dihydroxynaphthalene, trihydroxynaphthalene, hydroxyanthracene, dihydroxyanthracene, and trihydroxyanthracene.

The ring A and the ring B each are a benzene ring, a naphthalene ring, or an anthracene ring.

When the ring A is a benzene ring, n1 is an integer of 0 to 4. When the ring A is a naphthalene ring, n1 is an integer of 0 to 6. When the ring A is an anthracene ring, n1 is an integer of 0 to 8.

n2 is an integer of 0 to 1.

When the ring B is a benzene ring, n3 is an integer of 0 to 3. When the ring B is a naphthalene ring, n3 is an integer of 0 to 5. When the ring B is an anthracene ring, n3 is an integer of 0 to 7.

The unit structure of Formula (1) may be, for example, a unit structure in which both ring A and ring B are benzene rings, n1, n2, and n3 are 0, and $R^4$ is a hydrogen atom.

The unit structure of Formula (1) may be a unit structure in which $R^5$ is a hydrogen atom, or a phenyl group, a naphthyl group, an anthryl group, or a pyrenyl group that is optionally substituted with a halogen group, a nitro group, an amino group, a formyl group, a carboxy group, a carboxylic acid alkyl ester group, a phenyl group, a $C_{1-10}$ alkoxy group, or a hydroxy group, and $R^6$ is a hydrogen atom.

In the present invention, the unit structure of Formula (1) is formed by a reaction between a heterocyclic compound (heterocyclic group-containing aromatic compound) including the ring A and the ring B and an aldehyde or a ketone.

Examples of the aldehyde used for production of the polymer of the present invention may include saturated aliphatic aldehydes such as formaldehyde, paraformaldehyde, acetaldehyde, propylaldehyde, butyraldehyde, isobutyraldehyde, valeraldehyde, capronaldehyde, 2-methylbutyraldehyde, hexylaldehyde, undecanealdehyde, 7-methoxy-3,7-dimethyloctylaldehyde, cyclohexanealdehyde, 3-methyl-2-butyraldehyde, glyoxal, malonaldehyde, succinaldehyde, glutaraldehyde, glutaraldehyde, and adipaldehyde, unsaturated aliphatic aldehydes such as acrolein and methacrolein, heterocyclic aldehydes such as furfural and pyridine aldehyde, and aromatic aldehydes such as benzaldehyde, naphthylaldehyde, anthrylaldehyde, phenanthrylaldehyde, salicylaldehyde, phenylacetaldehyde, 3-phenylpropionaldehyde, tolylaldehyde, (N,N-dimethylamino)benzaldehyde, acetoxybenzaldehyde, 1-pyrenecarboxaldehyde, anisaldehyde, and terephthalaldehyde. In particular, the aromatic aldehydes are preferably used.

The ketones used for production of the polymer of the present invention are diarylketones, and examples of the diarylketones include diphenylketone, phenylnaphthylketone, dinaphthylketone, phenyltolylketone, ditolylketone, and 9-fluorenone.

The polymer used in the present invention is a novolac resin obtained by condensing the aldehyde or the ketone and the heterocyclic compound (heterocyclic group-containing aromatic compound) including the ring A and the ring B. In this condensation reaction, the aldehyde or the ketone can be used in a ratio of 0.1 equivalents to 10 equivalents to 1 equivalent of the phenyl group that is included in the heterocyclic group-containing aromatic compound and participates in the reaction.

An acid catalyst is used in the condensation reaction. Examples of the acid catalyst may include mineral acids such as sulfuric acid, phosphoric acid, and perchloric acid, organic sulfonic acids such as p-toluenesulfonic acid and p-toluenesulfonic acid monohydrate, and carboxylic acids such as formic acid and oxalic acid.

A used amount of the acid catalyst is variously selected depending on the type of the used acid. The used amount is usually 0.001 parts by mass to 10,000 parts by mass, preferably 0.01 parts by mass to 1,000 parts by mass, and more preferably 0.1 parts by mass to 100 parts by mass to 100 parts by mass of the heterocyclic group-containing aromatic compound.

The condensation reaction is carried out without a solvent. However, the reaction is usually carried out using a solvent. All solvents can be used as long as the solvents do not inhibit the reaction. Examples of the solvents may include cyclic ethers such as tetrahydrofuran and dioxane. When the acid catalyst used is a liquid acid such as formic acid, the acid catalyst can also act as the solvent.

A reaction temperature at the time of the condensation is usually 40° C. to 200° C. A reaction time is variously selected depending on the reaction temperature and is usually 30 minutes to 50 hours.

A weight average molecular weight Mw of thus obtained polymer is usually 500 to 1,000,000 or 600 to 200,000.

The polymer having the unit structure of Formula (1) can be exemplified as follows:

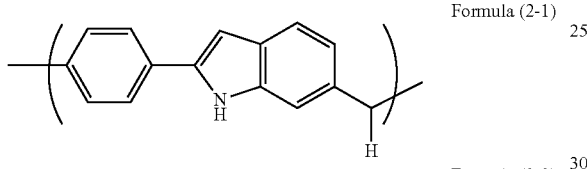

Formula (2-1)

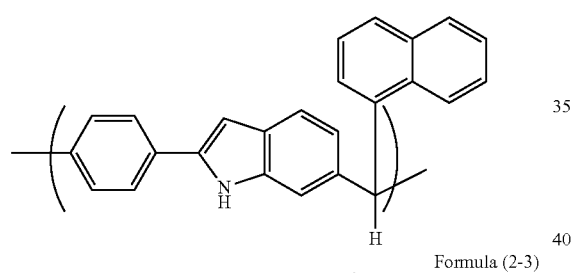

Formula (2-2)

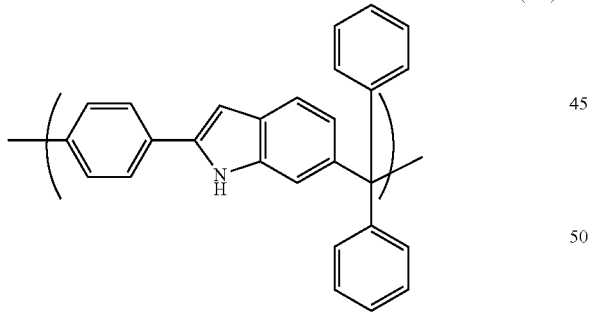

Formula (2-3)

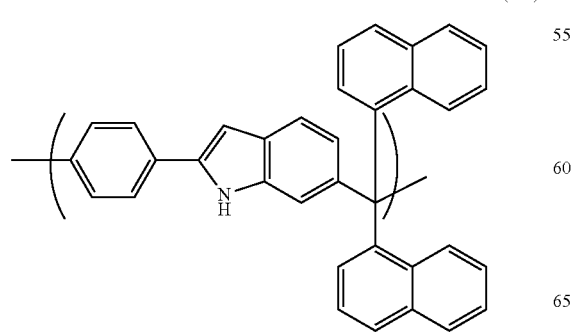

Formula (2-4)

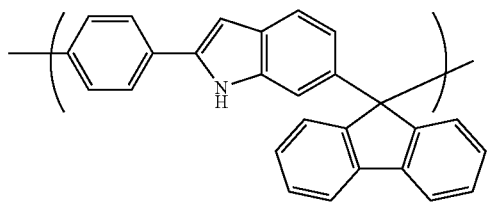

Formula (2-5)

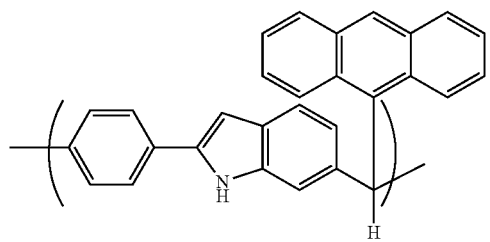

Formula (2-6)

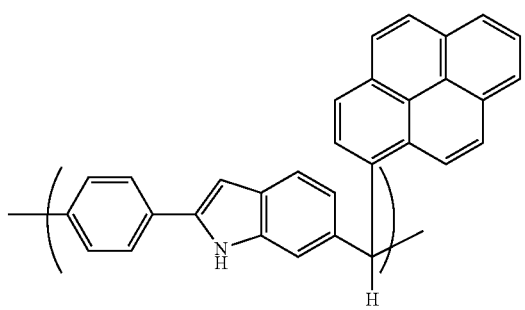

Formula (2-7)

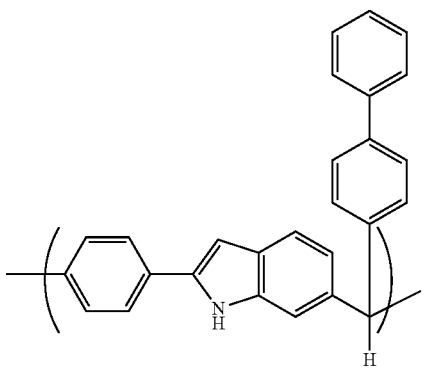

Formula (2-8)

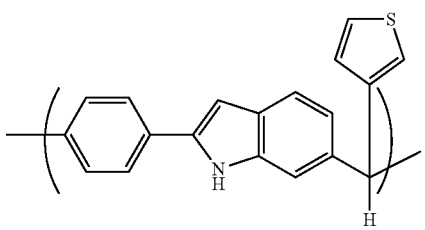

Formula (2-9)

-continued

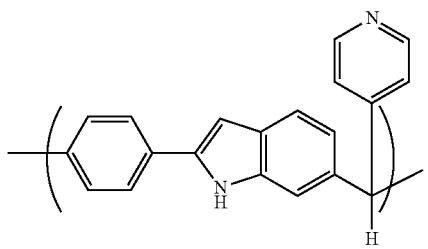
Formula (2-10)

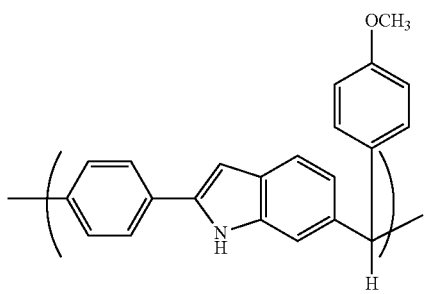
Formula (2-11)

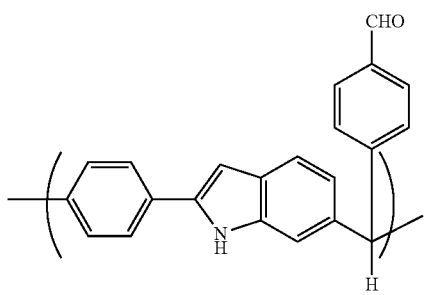
Formula (2-12)

The polymer can be used by mixing another polymer within 30% by mass in the whole polymer.

Example of the added polymer may include a polyacrylic acid ester compound, a polymethacrylic acid ester compound, a polyacrylamide compound, a polymethacrylamide compound, a polyvinyl compound, a polystyrene compounds, a polymaleimide compound, a polymaleic acid anhydride, and a polyacrylonitrile compound.

Examples of a raw material monomer of the polyacrylic acid ester compound may include methyl acrylate, ethyl acrylate, isopropyl acrylate, benzyl acrylate, naphthyl acrylate, anthryl acrylate, anthrylmethyl acrylate, phenyl acrylate, 2-hydroxyethyl acrylate, 2-hydroxypropyl acrylate, 2,2,2-trifluoroethyl acrylate, 4-hydroxybutyl acrylate, isobutyl acrylate, tert-butyl acrylate, cyclohexyl acrylate, isobornyl acrylate, 2-methoxyethyl acrylate, methoxytriethylene glycol acrylate, 2-ethoxyethyl acrylate, tetrahydrofurfuryl acrylate, 3-methoxybutyl acrylate, 2-methyl-2-adamantyl acrylate, 2-ethyl-2-adamantyl acrylate, 2-propyl-2-adamantyl acrylate, 2-methoxybutyl-2-adamantyl acrylate, 8-methyl-8-tricyclodecyl acrylate, 8-ethyl-8-tricyclodecyl acrylate, and 5-acryloyloxy-6-hydroxynorbornene-2-carboxylic-6-lactone.

Examples of a raw material monomer of the polymethacrylic acid ester compound may include ethyl methacrylate, normal-propyl methacrylate, normal-pentyl methacrylate, cyclohexyl methacrylate, benzyl methacrylate, naphthyl methacrylate, anthryl methacrylate, anthrylmethyl methacrylate, phenyl methacrylate, 2-phenylethyl methacrylate, 2-hydroxyethyl methacrylate, 2-hydroxypropyl methacrylate, 2,2,2-trifluoroethyl methacrylate, 2,2,2-trichloroethyl methacrylate, methyl acrylate, isobutyl methacrylate, 2-ethylhexyl methacrylate, isodecyl methacrylate, normal-lauryl methacrylate, normal-stearyl methacrylate, methoxydiethylene glycol methacrylate, methoxypolyethylene glycol methacrylate, tetrahydrofurfuryl methacrylate, isobornyl methacrylate, tert-butyl methacrylate, isostearyl methacrylate, normal-butoxyethyl methacrylate, 3-chloro-2-hydroxypropyl methacrylate, 2-methyl-2-adamantyl methacrylate, 2-ethyl-2-adamantyl methacrylate, 2-propyl-2-adamantyl methacrylate, 2-methoxybutyl-2-adamantyl methacrylate, 8-methyl-8-tricyclodecyl methacrylate, 8-ethyl-8-tricyclodecyl methacrylate, 5-methacryloyloxy-6-hydroxynorbornene-2-carboxylic-6-lactone, and 2,2,3,3,4,4,4-heptafluorobutyl methacrylate.

Examples of the polyacrylamide compound may include acrylamide, N-methyl acrylamide, N-ethyl acrylamide, N-benzyl acrylamide, N-phenyl acrylamide, and N,N-dimethyl acrylamide.

Examples of a raw material monomer of the polymethacrylamide compound may include methacrylamide, N-methyl methacrylamide, N-ethyl methacrylamide, N-benzyl methacrylamide, N-phenyl methacrylamide, and N,N-dimethyl methacrylamide.

Examples of a raw material monomer of the polyvinyl compound may include vinyl ether, methyl vinyl ether, benzyl vinyl ether, 2-hydroxyethyl vinyl ether, phenyl vinyl ether, and propyl vinyl ether.

Examples of a raw material monomer of the polystyrene compound may include styrene, methylstyrene, chlorostyrene, bromostyrene, and hydroxystyrene.

Examples of a raw material monomer of the polymaleimide compound may include maleimide, N-methylmaleimide, and N-phenylmaleimide, and N-cyclohexylmaleimide.

These polymers can be produced by dissolving the addition polymerizable monomer and a chain transfer agent (10% or less of the agent is added to the mass of the monomer), which is added if necessary, into an organic solvent, thereafter carrying out the polymerization reaction by adding a polymerization initiator, and then adding a polymerization terminator. An added amount of the polymerization initiator to the mass of the monomer is 1% to 10% and an added amount of polymerization terminator is 0.01% by mass to 0.2% by mass. Examples of the used organic solvent may include propylene glycol monomethyl ether, propylene glycol monopropyl ether, ethyl lactate, cyclohexanone, methyl ethyl ketone, and dimethylformamide. Examples of the chain transfer agent may include dodecanethiol and dodecylthiol. Examples of the polymerization initiator may include azobisisobutyronitrile and azobiscyclohexanecarbonitrile. Example of the polymerization terminator may include 4-methoxyphenol. A reaction temperature and a reaction time are adequately selected from 30° C. to 100° C. and 1 hour to 48 hours, respectively.

The resist underlayer film forming composition of the present invention can include a crosslinking agent component. Examples of the crosslinking agent may include a melamine-based agent, a substituted urea-based agent, or a polymer-based agent thereof. Preferably, the crosslinking agent has at least two crosslink-forming substituents. Examples of the crosslinking agent may include compounds such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, or methoxymethylated thiourea. A condensate of these compounds can also be used.

As the crosslinking agent, a crosslinking agent having high heat resistance can be used. As the crosslinking agent having high heat resistance, a compound containing crosslink-forming substituents having aromatic rings (for example, benzene rings or naphthalene rings) in a molecule can preferably be used.

Examples of the compound may include a compound having a partial structure of Formula (3) and a polymer or an oligomer having a repeating unit of Formula (4).

In Formula (3), $R^{10}$ and $R^{11}$ each are a hydrogen atom, a $C_{1-10}$ alkyl group, or a $C_{6-20}$ aryl group, n10 is an integer of 1 to 4, n11 is an integer of 1 to (5-n10), and (n10+n11) is an integer of 2 to 5.

In Formula (4), $R^{12}$ is a hydrogen atom or a $C_{1-10}$ alkyl group, $R^{13}$ is a $C_{1-10}$ alkyl group, n12 is an integer of 1 to 4, n13 is 0 to (4-n12), and (n12+n13) is an integer of 1 to 4. The oligomer and the polymer can use the repeating unit structure in a range of 2 to 100 or 2 to 50.

As the alkyl group and the aryl group, the above-described alkyl group and aryl group can be exemplified.

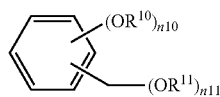

Formula (3)

Formula (4)

Compounds, polymers, and oligomers of Formula (3) and Formula (4) are exemplified as follows:

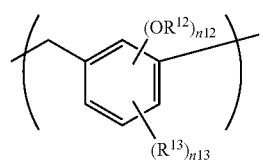

Formula (3-1)

Formula (3-2)

Formula (3-3)

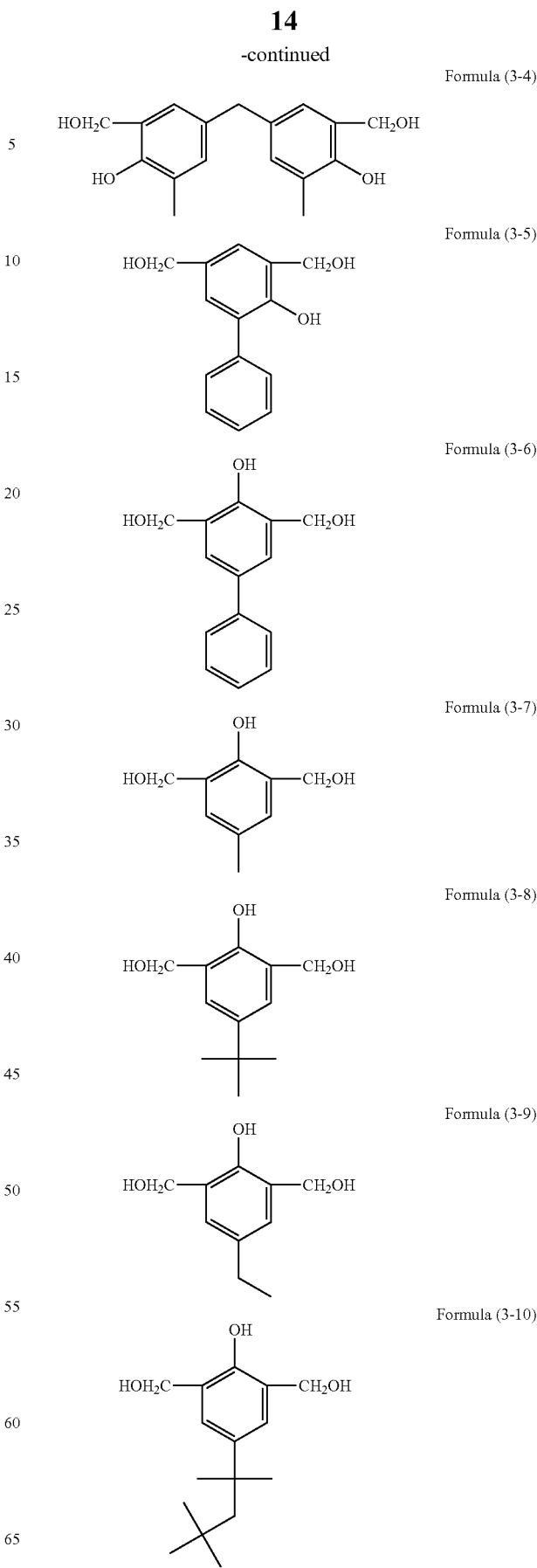

Formula (3-11)
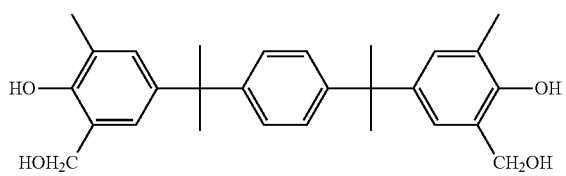
Formula (3-12)
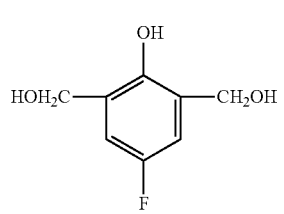
Formula (3-13)
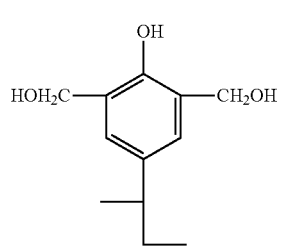
Formula (3-14)
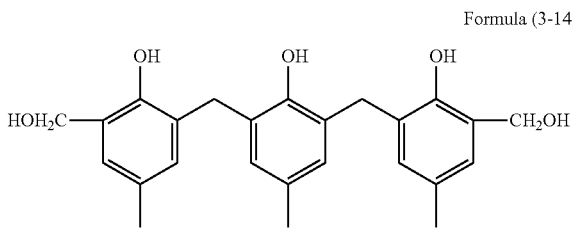
Formula (3-15)
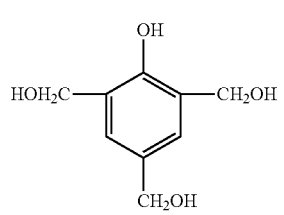
Formula (3-16)
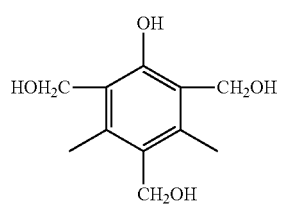
Formula (3-17)
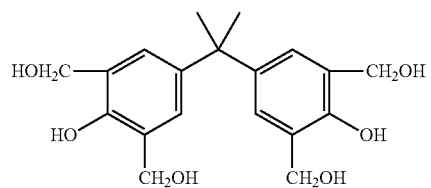
Formula (3-18)
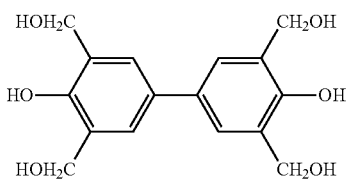
Formula (3-19)
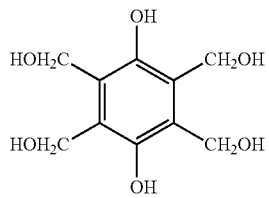
Formula (3-20)
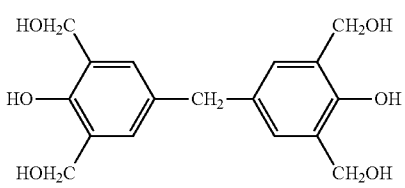
Formula (3-21)
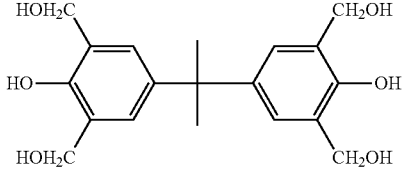
Formula (3-22)
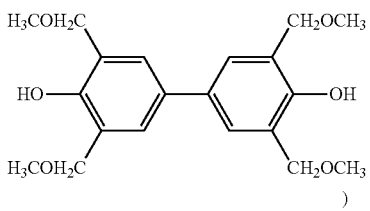
Formula (3-23)
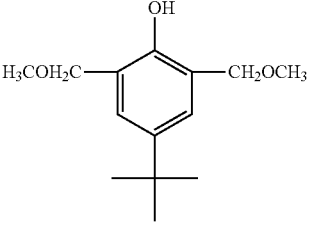
Formula (3-24)
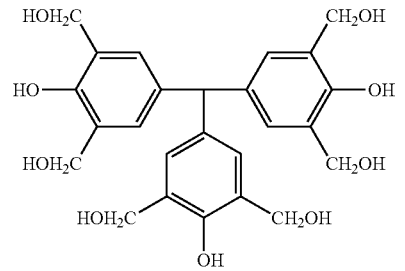

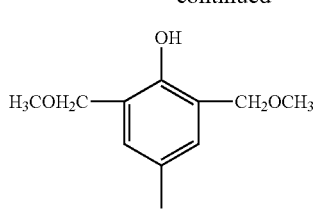

Formula (3-25)

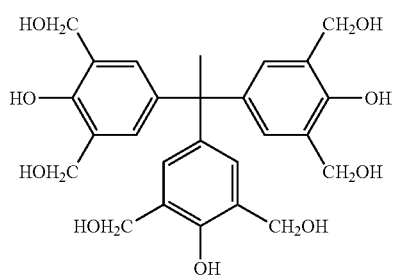

Formula (3-26)

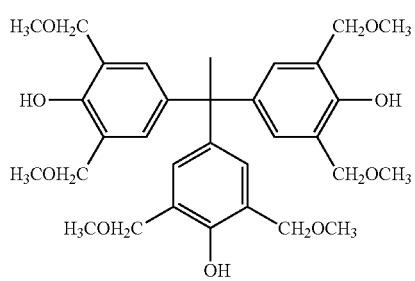

Formula (3-27)

The compounds can be obtained as commercial products manufactured by Asahi Organic Chemicals Industry Co., Ltd. and HONSHU CHEMICAL INDUSTRY CO., LTD. For example, among the crosslinking agent, the compound of Formula (3-21) can be purchased as TM-BIP-A (trade name, manufactured by Asahi Organic Chemicals Industry Co., Ltd.). The compound of Formula (3-22) can be purchased as TMOM-BP (trade name, manufactured by HONSHU CHEMICAL INDUSTRY CO., LTD.).

An added amount of the crosslinking agent varies depending on a used application solvent, a used base substrate, a required solution viscosity, and required film shape. The added amount is 0.001% by mass to 80% by mass, preferably 0.01% by mass to 50% by mass, and further preferably 0.05% by mass to 40% by mass to the total solid content. Although these crosslinking agents may cause a crosslink reaction by self-condensation, when crosslinkable substituents exist in the polymer of the present invention, the crosslinking agent can cause a crosslink reaction with these crosslinkable substituents.

Examples of catalysts for accelerating the crosslink reaction formulated in the present invention include acid compounds such as p-toluenesulfonic acid, trifluoromethanesulfonic acid, pyridinium p-toluenesulfonic acid, salicylic acid, sulfosalicylic acid, citric acid, benzoic acid, hydroxybenzoic acid, and naphthalene carboxylic acid and/or thermal acid generators such as 2,4,4,6-tetrabromocyclohexadienone, benzoin tosylate, 2-nitrobenzyl tosylate, other organic sulfonic acid allyl esters, and a quaternary ammonium salt of trifluoromethanesulfonic acid. A formulated amount of the catalyst is 0.0001% by mass to 20% by mass, preferably 0.0005% by mass to 10% by mass, and preferably 0.01% by mass to 3% by mass to the total solid content.

To the resist underlayer film forming composition for lithography of the present invention, a photoacid generator can be added in order to match acidity of the composition to a photoresist covering the resist underlayer film as an upper layer in a lithography process. Examples of the preferable photoacid generator may include onium salt-based photoacid generators such as bis(4-t-butylphenyl)iodonium trifluoromethanesulfonate and triphenylsulfonium trifluoromethanesulfonate, halogen-containing compound-based photoacid generators such as phenyl-bis(trichloromethyl)-s-triazine, and sulfonic acid-based photoacid generators such as benzoin tosylate and N-hydroxysuccinimide trifluoromethanesulfonate. An added amount of the photoacid generator is 0.2% by mass to 10% by mass and preferably 0.4% by mass to 5% by mass to the total solid content.

To the resist underlayer film material for lithography of the present invention, for example, a light absorbent, a rheology modifier, an adhesion assistance agent, and a surfactant can be added other than the components described above if necessary.

As further light absorbents, for example, commercially available light absorbents described in "*Kogyoyou Shikiso no Gijyutu to Shijyo* (Technology and Market of Industrial Colorant)" (CMC Publishing Co., Ltd) and "*Senryo Binran* (Dye Handbook)" (The Society of Synthetic Organic Chemistry, Japan) can be preferably used. Examples of the commercially available light absorbents include C. I. Disperse Yellow 1, 3, 4, 5, 7, 8, 13, 23, 31, 49, 50, 51, 54, 60, 64, 66, 68, 79, 82, 88, 90, 93, 102, 114, and 124; C. I. Disperse Orange 1, 5, 13, 25, 29, 30, 31, 44, 57, 72, and 73; C. I. Disperse Red 1, 5, 7, 13, 17, 19, 43, 50, 54, 58, 65, 72, 73, 88, 117, 137, 143, 199, and 210; C. I. Disperse Violet 43; C. I. Disperse Blue 96; C. I. Fluorescent Brightening Agent 112, 135, and 163; C. I. Solvent Orange 2 and 45; C. I. Solvent Red 1, 3, 8, 23, 24, 25, 27, and 49; C. I. Pigment Green 10; and C. I. Pigment Brown 2. The light absorbents are usually formulated in ratio of 10% by mass or less, and preferably in a ratio of 5% by mass or less to the total solid content of the resist underlayer film material for lithography.

The rheology modifier is added for the purpose of mainly improving flowability of the resist underlayer film forming composition, and, particularly in a baking process, improving film thickness uniformity of the resist underlayer film and enhancing filling ability of the resist underlayer film forming composition into inside of a hole. Specific examples of the rheology modifier may include phthalic acid derivatives such as dimethyl phthalate, diethyl phthalate, diisobutyl phthalate, dihexyl phthalate, and butyl isodecyl phthalate, adipic acid derivatives such as di-normal-butyl adipate, diisobutyl adipate, diisooctyl adipate, and octyldecyl adipate, maleic acid derivatives such as di-normal-butylmaleate, diethyl maleate, and dinonyl maleate, oleic acid derivatives such as methyl oleate, butyl oleate, and tetrahydrofurfuryl oleate, or stearic acid derivatives such as normal-butyl stearate and glyceryl stearate. These rheology modifiers are usually formulated in a ratio of less than 30% by mass to the total solid content of the resist underlayer film material for lithography.

The adhesion assistance agent is added for the purpose of mainly improving adhesion between the substrate or the resist and the resist underlayer film forming composition and, particularly in a baking process, not peeling the resist. Specific examples of the adhesion assistance agent may include chlorosilanes such as trimethylchlorosilane, dimethylvinylchlorosilane, methyldiphenylchlorosilane, and chloromethyldimethylchlorosilane, alkoxysilanes such as trimethylmethoxysilane, dimethyldiethoxysilane, methyldimethoxysilane, dimethylvinylethoxysilane, diphenyldimethoxysilane, and phenyltriethoxysilane, silazanes such as hexamethyldisilazane, N,N'-bis(trimethylsilyl)urea, dimethyltrimethylsilylamine, and trimethylsilylimidazole, silanes such as vinyltrichlorosilane, γ-chloropropyltrimethoxysilane, γ-aminopropyltriethoxysilane, and γ-glycidoxypropyltrimethoxysilane, heterocyclic compounds such as benzotriazole, benzimidazole, indazole, imidazole, 2-mercaptobenzimidazole, 2-mercaptobenzothiazole, 2-mercaptobenzoxazole, urazol, thiouracil, mercaptoimidazole, and mercaptopyrimidine, and urea compounds or thiourea compounds such as 1,1-dimethylurea and 1,3-dimethylurea. These adhesion assistance agents are usually formulated in a ratio less than 5% by mass or less, and preferably in a ratio of less than 2% by mass to the total solid content of the resist underlayer film material for lithography.

To the resist underlayer film material for lithography of the present invention, a surfactant can be formulated for the purpose of preventing generation of pinholes and striations and further improving applicability to surface unevenness. Examples of the surfactant may include nonionic surfactant such as polyoxyethylene alkyl ethers such as polyoxyethylene lauryl ether, polyoxyethylene stearyl ether, polyoxyethylene cetyl ether, and polyoxyethylene oleyl ether; polyoxyethylene alkylallyl ethers such as polyoxyethylene octylphenol ether and polyoxyethylene nonylphenol ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as Eftop EF301, EF303, and EF352 (trade name, manufactured by TOHKEM PRODUCTS CORPORATION), Megafac F171, F173, and R-30 (trade name, manufactured by Dainippon Ink and Chemicals Co., Ltd.), Fluorad FC430 and FC431 (trade name, manufactured by Sumitomo 3M Ltd.), Asahi guard AG710, Surflon S-382, SC101, SC102, SC103, SC104, SC105, and SC106 (trade name, Asahi Glass Co., Ltd.); and Organosiloxane Polymer KP341 (manufactured by Shin-Etsu Chemical Co., Ltd.). A formulated amount of these surfactants is usually 2.0% by mass or less and preferably 1.0% by mass or less to the total solid content of the resist underlayer film material for lithography of the present invention. These surfactants can be added singly or in combination of two or more surfactants.

Examples of solvents used for dissolving the polymer, the crosslinking agent component, and the crosslinking catalyst in the present invention may include ethylene glycol monomethyl ether, ethylene glycol monoethyl ether, ethylene glycol monobutyl ether, ethylene glycol mono-isopropyl ether, ethylene glycol methyl ether acetate, ethylene glycol ethyl ether acetate, methyl cellosolve acetate, ethyl cellosolve acetate, diethylene glycol, diethylene glycol monomethyl ether, diethylene glycol monoethyl ether, diethylene glycol dimethyl ether, diethylene glycol diethyl ether, diethylene glycol monoethyl ether acetate, propylene glycol, propylene glycol monomethyl ether, propylene glycol monobutyl ether, propylene glycol monomethyl ether acetate, propylene glycol monoethyl ether, propylene glycol monoethyl ether acetate, propylene glycol propyl ether acetate, dipropylene glycol monomethyl ether, dipropylene glycol monoethyl ether, triethylene glycol dimethyl ether, toluene, xylene, styrene, methyl ethyl ketone, cyclopentanone, cyclohexanone, ethyl 2-hydroxypropionate, ethyl 2-hydroxy-2-methyl-propionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 1-octanol, ethylene glycol, hexylene glycol, trimethylene glycol, 1-methoxy-2-butanol, cyclohexanol, diacetone alcohol, furfuryl alcohol, tetrahydrofurfuryl alcohol, propylene glycol, benzyl alcohol, 1,3-butanediol, 1,4-butanediol, 2,3-butanediol, γ-butyrolactone, acetone, methyl isopropyl ketone, diethyl ketone, methyl isobutyl ketone, methyl normal-butyl ketone, isopropyl acetate ketone, normal-propyl acetate, isobutyl acetate, methanol, ethanol, isopropanol, tert-butanol, allyl alcohol, normal-propanol, 2-methyl-2-butanol, isobutanol, normal-butanol, 2-methyl-1-butanol, 1-pentanol, 2-methyl-1-pentanol, 2-ethylhexanol, 1-octanol, ethylene glycol, hexylene glycol, trimethylene glycol, 1-methoxy-2-butanol, diacetone alcohol, furfuryl alcohol, tetrahydrofurfuryl alcohol, propylene glycol, benzyl alcohol, isopropyl ether, 1,4-dioxane, N,N-dimethylformamide, N,N-dimethylacetamide, N-methylpyrrolidone, 1,3-dimethyl-2-imidazolidinone, dimethyl sulfoxide, and N-cyclohexyl-2-pyrrolidinone. These solvents can be used singly or in combination of two or more solvents.

These solvents can be used by mixing with a high boiling point solvent such as propylene glycol monobutyl ether and propylene glycol monobutyl ether acetate. Among these solvents, propylene glycol monomethyl ether, propylene glycol monomethyl ether acetate, propylene glycol monobutyl ether, ethyl lactate, butyl lactate, and cyclohexanone are preferable from the viewpoint of improving a leveling property.

The resist used in the present invention is a photoresist and an electron beam resist.

As the photoresist applied onto the resist underlayer film for lithography of the present invention, both negative type photoresist and positive type photoresist can be used. Examples of the resists include a positive type photoresist made of a novolac resin and 1,2-naphthoquinonediazidesulfonic acid ester; a chemically amplified photoresist made of a photoacid generator and a binder having a group that increases an alkali dissolution rate by decomposing with an acid; a chemically amplified photoresist made of an alkali-soluble binder, a low molecular weight compound that increases an alkali dissolution rate of the photoresist by decomposing with an acid, and a photoacid generator; a chemically amplified photoresist made of a binder having a group that increases an alkali dissolution rate by decomposing with an acid, a low molecular weight compound that increases an alkali dissolution rate of the photoresist by decomposing with an acid, and a photoacid generator; and a photoresist having Si atoms in the framework of the molecule. Specific examples may include APEX-E (trade name, manufactured by Rohm and Haas Inc.)

Examples of the electron beam resist applied on the resist underlayer film for lithography of the present invention may include a composition made of a resin containing Si—Si bonds in the main chain and containing aromatic rings at its ends and an acid generator generating an acid by irradiation with an electron beam and a composition made of poly(p-hydroxystyrene) in which hydroxy groups are substituted with organic groups containing N-carboxyamine and an acid generator generating an acid by irradiation with an electron beam. The latter electron beam resist composition is an electron beam resist composition in which an acid generated from an acid generator by electron beam irradiation reacts with the N-carboxyaminoxy group in a polymer side chain and the polymer side chain is decomposed to a hydroxy group, and thus the resist composition is dissolved into an alkali development solution due to its alkali solubility to form a resist pattern. Examples of the acid generator generating the acid by electron beam irradiation may include halogenated organic compounds such as 1,1-bis[p-chlorophenyl]-2,2,2-trichloroethane, 1,1-bis[p-methoxyphenyl]-2,2,2-trichloroethane, 1,1-bis[p-chlorophenyl]-2,2-dichloroethane, and 2-chloro-6-(trichloromethyl)pyridine, onium salts such as triphenyl sulfonium salt and diphenyl iodonium salt, and sulfonic acid ester such as nitrobenzyltosylate and dinitrobenzyltosylate.

Examples of development solutions for the resist having the resist underlayer film formed by using the resist underlayer film material for lithography of the present invention may include solutions of inorganic alkalis such as sodium hydroxide, potassium hydroxide, sodium carbonate, sodium silicate, sodium metasilicate, and aqueous ammonia, primary amines such as ethylamine and n-propylamine, secondary amines such as diethylamine and di-n-butylamine, tertiary amines such as triethylamine and methyldiethylamine, alcoholamines such as dimethylethanolamine and triethanolamine, quaternary ammonium salts such as tetramethylammonium hydroxide, tetraethylammonium hydroxide, and choline, and cyclic amines such as pyrrole and piperidine. The resist development solution can also be used by adding an adequate amount of alcohols such as isopropyl alcohol and surfactants such as nonion type surfactant to the aqueous solution of the alkalis. Among these development solutions, aqueous solutions of the quaternary ammonium salts are preferable, and aqueous solutions of tetraethylammonium hydroxide and choline are further preferable.

Subsequently, a method for forming the resist pattern of the present invention will be described. The resist underlayer film forming composition is applied onto a substrate (for example, silicon/silicon dioxide, a glass substrates and a transparent substrate such as an ITO substrate) used for producing precision integrated circuit devices by an adequate application method such as a spinner and a coater and thereafter the coated composition is cured by baking to form an application type underlayer film. A film thickness of the resist underlayer film is preferably 0.01 µm to 3.0 µm. Conditions for baking after application are 80° C. to 350° C. for 0.5 minutes to 120 minutes. Thereafter, the resist is directly applied onto the resist underlayer film or applied after forming a film of one layer or several layers of the coating material on the application type underlayer film if necessary. Thereafter, the resist is irradiated with light or an electron beam through the predetermined mask and is developed, rinsed, and dried to be able to obtain an excellent resist pattern. Post Exposure Bake (PEB) of light and an electron beam can also be carried out if necessary. A part of the resist underlayer film where the resist is removed by developing in the previous process is removed by dry etching to be able to form a desired pattern on the substrate.

The exposure light of the photoresist is actinic rays such as near ultraviolet rays, far ultraviolet rays, or extreme ultraviolet rays (for example, EUV, wavelength 13.5 nm) and, for example, light having a wavelength of 248 nm (KrF laser light), 193 nm (ArF laser light), or 157 nm ($F_2$ laser light) is used. The light irradiation can be used without limitation as long as an acid is generated from the photoacid generator. An exposure amount is 1 $mJ/cm^2$ to 2,000 $mJ/cm^2$, 10 $mJ/cm^2$ to 1,500 $mJ/cm^2$, or 50 $mJ/cm^2$ to 1,000 $mJ/cm^2$.

The electron beam irradiation for the electron beam resist can be performed by, for example, an electron beam irradiation device.

In the present invention, a semiconductor device can be produced through a method including the steps of forming the underlayer film onto a semiconductor substrate by use of the resist underlayer film forming composition; forming a resist film on the underlayer film; forming a resist pattern by irradiation with light or an electron beam and development; etching the underlayer film by use of the resist pattern; and processing the semiconductor substrate by use of the patterned underlayer film.

Hereinafter, when formation of finer resist pattern progresses, an issue of resolution and an issue of resist pattern collapse after development arise and thus thinner resist film formation is desired. Therefore, it is difficult to obtain a sufficient resist pattern film thickness in substrate processing. As a result, a process in which not only the resist pattern but also a resist underlayer film formed between the resist and the semiconductor substrate to be processed have a function as a mask at the time of the substrate processing has been required. As a resist underlayer film for the process as described above, different from a conventional high etch rate resist underlayer film, a resist underlayer film for lithography having a selectivity of the dry etching rate close to that of the resist, a resist underlayer film for lithography having a selectivity of the dry etching rate smaller than that of the resist, and a resist underlayer film for lithography having a selectivity of the dry etching rate smaller than that of the semiconductor substrate have been required. The resist underlayer film described above can also provide an anti-reflection function and can also have a function of the conventional anti-reflective coatings.

On the other hand, in order to obtain a fine resist pattern, a process in which, at the time of dry etching of the resist underlayer film, the resist pattern and the resist underlayer film is formed so as to be narrower than a pattern width at the time of resist development has started to be used. As the resist underlayer film used for the process described above, different from a conventional high etch rate anti-reflective coating, a resist underlayer film having a selectivity of the dry etching rate close to that of the resist has been required. The resist underlayer film described above can also provide an anti-reflection function and can also have a function of the conventional anti-reflective coatings.

In the present invention, after the resist underlayer film of the present invention is formed on the substrate, the resist can be directly applied onto the resist underlayer film or applied after forming a film of one layer or several layers of the coating material on the underlayer film if necessary. By this process, the pattern width of the resist becomes narrower and the substrate can be processed by selecting adequate etching gas even when the resist is thinly applied in order to prevent pattern collapse.

In other words, a semiconductor device can be produced through a method including the steps of forming the resist underlayer film by use of the resist underlayer film forming composition onto a semiconductor substrate; forming a hard mask made of a coating material containing a silicon component or a hard mask (for example, silicon oxynitride) formed by vapor deposition on the underlayer film; further forming a resist film on the hard mask; forming a resist pattern by irradiation with light or an electron beam and development; etching the hard mask by use of the resist pattern with halogen-based gas; etching the underlayer film by use of the patterned hard mask with oxygen-based gas or hydrogen-based gas; and processing the semiconductor substrate by use of the patterned underlayer film with halogen-based gas.

Considering the effect as the anti-reflective coating, the resist underlayer film forming composition for lithography of the present invention includes a light absorbing moiety in the framework of the polymer and thus has no diffused substance into the photoresist during drying by heating and the light absorbing moiety has sufficient large light absorbing performance. Therefore, the resist underlayer film forming composition has the high anti-reflective effect.

The resist underlayer film forming composition for lithography of the present invention has high heat stability, can prevent contamination to the upper layer caused by decomposed substances at the time of baking, and has allowance of temperature margin during the baking process.

Depending on the process conditions, a film made of the resist underlayer film material for lithography of the present invention can be used as a film having a function that prevents light reflection and further having a function that prevents interaction between the substrate and the photoresist or prevents adverse effects of the material used for the photoresist or a substrate generated at the time of exposure to the photoresist.

EXAMPLES

Synthesis Example 1

To a 100 mL four-necked flask, 2-phenylindole (4.00 g, 0.021 mol, manufactured by Tokyo Chemical Industry Co., Ltd.), 1-naphthaldehyde (3.23 g, 0.021 mol, manufactured by Tokyo Chemical Industry Co., Ltd.), and p-toluene sulfonic acid monohydrate (0.619 g, 0.0031 mol, manufactured by KANTO CHEMICAL CO., INC.) were added and then toluene (14.58 g, manufactured by KANTO CHEMICAL CO., INC.) was charged. The mixture was stirred and a temperature of the mixture rose to 110° C. to dissolve the mixture and to start polymerization. After 50 minutes, the resulting mixture was allowed to cool to room temperature and was reprecipitated in methanol (300 g, manufactured by KANTO CHEMICAL CO., INC.). The obtained precipitate was filtered and dried at 50° C. for 10 hours in a vacuum drier to obtain 4.5 g of a target polymer (Formula (2-2), hereinafter abbreviated as PId-NA).

A weight average molecular weight Mw and a polydispersity Mw/Mn of PId-NA measured by GPC in terms of polystyrene were 2,400 and 1.35, respectively.

Synthesis Example 2

To a 100 mL four-necked flask, 2-phenylindole (3.50 g, 0.018 mol, manufactured by Tokyo Chemical Industry Co., Ltd.), 1-pyrene-carboxaldehyde (4.17 g, 0.018 mol, manufactured by Tokyo Chemical Industry Co., Ltd.), and p-toluene sulfonic acid monohydrate (0.541 g, 0.0027 mol, manufactured by KANTO CHEMICAL CO., INC.) were added and then 1,4-dixoane (15.25 g, manufactured by KANTO CHEMICAL CO., INC.) was charged. The mixture was stirred and a temperature of the mixture rose to 110° C. to dissolve the mixture and to start polymerization. After 24 hours, the resulting mixture was allowed to cool to room temperature and was reprecipitated in methanol (250 g, manufactured by KANTO CHEMICAL CO., INC.). The obtained precipitate was filtered and dried at 50° C. for 10 hours and further 120° C. for 24 hours in a vacuum drier to obtain 3.7 g of a target polymer (Formula (2-7), hereinafter abbreviated as PId-Py).

A weight average molecular weight Mw and a polydispersity Mw/Mn of PId-Py measured by GPC in terms of polystyrene were 1,600 and 1.61, respectively.

Comparative Synthesis Example 1

To a 100 mL four-necked flask, carbazole (6.69 g, 0.040 mol, manufactured by Tokyo Chemical Industry Co., Ltd.), 9-fluorenone (7.28 g, 0.040 mol, manufactured by Tokyo Chemical Industry Co., Ltd.), and p-toluene sulfonic acid monohydrate (0.76 g, 0.0040 mol, manufactured by KANTO CHEMICAL CO., INC.) were added under nitrogen atmosphere and then 1,4-dixoane (6.69 g, manufactured by KANTO CHEMICAL CO., INC.) was charged. The mixture was stirred and a temperature of the mixture rose to 100° C. to dissolve the mixture and to start polymerization. After 24 hours, the resulting mixture was allowed to cool to 60° C. and chloroform (34 g, manufactured by KANTO CHEMICAL CO., INC.) was added to dilute, and then the diluted mixture was reprecipitated in methanol (168 g, manufactured by KANTO CHEMICAL CO., INC.). The obtained precipitate was filtered and dried at 80° C. for 24 hours in a vacuum drier to obtain 9.37 g of a target polymer (Formula (5-1), hereinafter abbreviated as PCzFL).

A weight average molecular weight Mw and a polydispersity Mw/Mn of PCzFL measured by GPC in terms of polystyrene were 2,800 and 1.77, respectively.

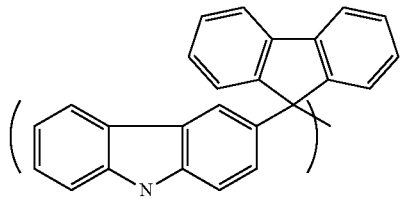

Formula (5-1)

Example 1

With 20 g of the resin obtained in Synthesis Example 1, 0.06 g of Megafac R-30 (trade name, manufactured by Dainippon Ink and Chemicals Co., Ltd.) as the surfactant was mixed and the mixture was dissolved in 80 g of propylene glycol monomethyl ether acetate to form a solution. Thereafter, the solution was filtered with a polyethylene microfilter having a pore diameter of 0.10 μm and further filtered with a polyethylene microfilter having a pore diameter of 0.05 μm to prepare a solution of a resist underlayer film forming composition used for a lithography process of a multilayer film.

Example 2

With 20 g of the resin obtained in Synthesis Example 1, 2.0 g of TMOM-BP (trade name, manufactured by Honshu Chemical Industry Co., Ltd.: Its component is 3,3',5,5'-tetramethoxymethyl-4,4'-dihydroxybiphenyl) as a crosslinking agent, 0.10 g of thermal acid generator TAG-2689 (trade name, manufactured by King Corporation (USA): Its component is a quaternary ammonium salt of trifluoromethanesulfonic acid) as a catalyst, and 0.06 g of Megafac R-30 (trade name, manufactured by Dainippon Ink and Chemicals Co., Ltd.) as a surfactant were mixed and the mixture was dissolved in 88 g of propylene glycol monomethyl ether acetate to form a solution. Thereafter, the solution was filtered with a polyethylene microfilter having a pore diameter of 0.10 μm and further filtered with a polyethylene microfilter having a pore diameter of 0.05 μm to prepare a solution of a resist underlayer film forming composition used for a lithography process of a multilayer film.

Example 3

With 20 g of the resin obtained in Synthesis Example 2, 0.06 g of Megafac R-30 (trade name, manufactured by Dainippon Ink and Chemicals Co., Ltd.) was mixed as a surfactant and the mixture was dissolved in 80 g of propylene glycol monomethyl ether acetate to form a solution. Thereafter, the solution was filtered with a polyethylene microfilter having a pore diameter of 0.10 μm and further filtered with a polyethylene microfilter having a pore diameter of 0.05 μm to prepare a solution of a resist underlayer film forming composition used for a lithography process of a multilayer film.

Example 4

With 20 g of the resin obtained in Synthesis Example 2, 2.0 g of TMOM-BP (trade name, manufactured by Honshu Chemical Industry Co., Ltd.: Its component is 3,3',5,5'-tetramethoxymethyl-4,4'-dihydroxybiphenyl) as a crosslinking agent, 0.10 g of thermal acid generator TAG-2689 (trade name, manufactured by King Corporation (USA): Its component is a quaternary ammonium salt of trifluoromethanesulfonic acid) as a catalyst, and 0.06 g of Megafac R-30 (trade name, manufactured by Dainippon Ink and Chemicals Co., Ltd.) as a surfactant were mixed and the mixture was dissolved in 88 g of propylene glycol monomethyl ether acetate to form a solution. Thereafter, the solution was filtered with a polyethylene microfilter having a pore diameter of 0.10 μm and further filtered with a polyethylene microfilter having a pore diameter of 0.05 μm to prepare a solution of a resist underlayer film forming composition used for a lithography process of a multilayer film.

Comparative Example 1

With 20 g of a commercially available cresol novolac resin (a novolac resin made by used of cresol and formaldehyde), 0.06 g of Megafac R-30 (trade name, manufactured by Dainippon Ink and Chemicals Co., Ltd.) as a surfactant was mixed and the mixture was dissolved in 80 g of propylene glycol monomethyl ether acetate to form a solution. Thereafter, the solution was filtered with a polyethylene microfilter having a pore diameter of 0.10 μm and further filtered with a polyethylene microfilter having a pore diameter of 0.05 μm to prepare a solution of a resist underlayer film forming composition used for a lithography process of a multilayer film. A weight average molecular weight Mw and a polydispersity Mw/Mn of the polymer measured by GPC in terms of polystyrene were 4,000 and 2.1, respectively.

Comparative Example 2

With 20 g of the resin obtained in Comparative Synthesis Example 1, 0.06 g of Megafac R-30 (trade name, manufactured by Dainippon Ink and Chemicals Co., Ltd.) as a surfactant was mixed and the mixture was dissolved in 80 g of propylene glycol monomethyl ether acetate to form a solution. Thereafter, the solution was filtered with a polyethylene microfilter having a pore diameter of 0.10 μm and further filtered with a polyethylene microfilter having a pore diameter of 0.05 μm to prepare a solution of a resist underlayer film forming composition used for a lithography process of a multilayer film.

(Measurement of Optical Parameters)

Each of the resist underlayer film solutions prepared in Examples 1 to 4 was applied onto a silicon wafer using a spin coater. The applied coatings were baked on a hot plate at 240° C. for 1 minute or at 400° C. for 2 minutes to form resist underlayer films (film thickness 0.25 μm). Refractive indices (n value) and optical absorption coefficients (k values, also called attenuation coefficients) of these resist underlayer films were measured using a spectroscopic ellipsometer at a wavelength of 248 nm and a wavelength of 193 nm. The result is shown in Table 1.

TABLE 1

| | | Refractive index n and optical absorption coefficient k | | | |
|---|---|---|---|---|---|
| | | n (248 nm) | k (248 nm) | n (193 nm) | k (193 nm) |
| Example 1 | 240° C. baked film | 2.06 | 0.43 | 1.43 | 0.51 |
| | 400° C. baked film | 1.70 | 0.45 | 1.43 | 0.51 |
| Example 2 | 240° C. baked film | 1.98 | 0.37 | 1.44 | 0.47 |
| | 400° C. baked film | 1.79 | 0.41 | 1.45 | 0.51 |
| Example 3 | 240° C. baked film | 1.87 | 0.67 | 1.55 | 0.72 |
| | 400° C. baked film | 1.77 | 0.63 | 1.53 | 0.69 |
| Example 4 | 240° C. baked film | 1.74 | 0.58 | 1.54 | 0.67 |
| | 400° C. baked film | 1.71 | 0.60 | 1.47 | 0.64 |

(Dissolution Test in Photoresist Solvent)

Each of the solutions of the resist underlayer film forming compositions prepared in Examples 1 to 4 and Comparative Example 1 was applied onto a silicon wafer using a spin coater. The applied coatings were baked on a hot plate at 400° C. for 2 minutes to form resist underlayer films (film thickness 0.25 μm). The resist underlayer films were immersed in solvents used for the resist including ethyl lactate, propylene glycol monomethyl ether, propylene glycol monomethyl ether acetate, and cyclohexanone and the resist underlayer films were confirmed to be insoluble.

(Measurement of Dry Etching Rate)

The following etcher and etching gas used for the measurement of the dry etching rate were used.

ES401 (manufactured by NIPPON SCIENTIFIC Co., Ltd.): $CF_4$

Each of the solutions of the resist underlayer film forming compositions prepared in Examples 1 to 4 and Comparative Example 1 was applied onto a silicon wafer using a spin coater. The applied coatings were baked on a hot plate at 240° C. for 1 minute or at 400° C. for 2 minutes to form resist underlayer films (film thickness 0.25 μm). A dry etching rate was measured using $CF_4$ as an etching gas.

Similarly, a solution of a phenol novolac resin (commercially available resin, A weight average molecular weight Mw and a polydispersity Mw/Mn of the phenol novolac resin measured by GPC in terms of polystyrene were 2,000 and 2.5, respectively) was applied onto a silicon wafer using a spin coater. The applied coating was baked at 205° C. for 1 minute to form a coating film. The dry etching rate was measured using $CF_4$ as an etching gas. The dry etching rates of the resist underlayer films in Examples 1 to 4 and Comparative Example 1 were compared to the etching rate of the phenol novolac resin (film thickness 0.25 μm) obtained by baking at 205° C. for 1 minute being determined as 1.00. The result was shown in Table 2. A rate ratio is a dry etching rate ratio of (resist underlayer film)/(phenol novolac resin film).

TABLE 2

| | Dry etching rate ratio | |
|---|---|---|
| | Rate ratio of 240° C. baked film | Rate ratio of 400° C. baked film |
| Example 1 | 0.71 | 0.84 |
| Example 2 | 0.77 | 0.89 |
| Example 3 | 0.70 | 0.73 |
| Example 4 | 0.72 | 0.78 |
| Comparative Example 1 | 1.00 | 1.15 |

(Embedding Property Test to Hole Wafer Substrate)

Each of the solutions of the resist underlayer film forming compositions prepared in Examples 1 to 4 and Comparative Example 2 was applied onto a hole wafer substrate using a spin coater. The applied coatings were baked on a hot plate at 400° C. for 2 minutes to form resist underlayer films (film thickness 0.25 μm). As the hole wafer substrate, a hole pattern having a diameter of 100 nm and a height of 400 nm was used.

The solutions of the resist underlayer film forming compositions prepared in Examples 1 to 4 were applied onto a hole wafer substrate using a spin coater and the applied coatings were baked at 400° C. for 2 minutes. Thereafter, the obtained substrate was cut and observed with an electron microscope. From the observation photographs FIGS. 1 to 4, it is found that the solutions were sufficiently filled inside of the holes.

Figure 5:
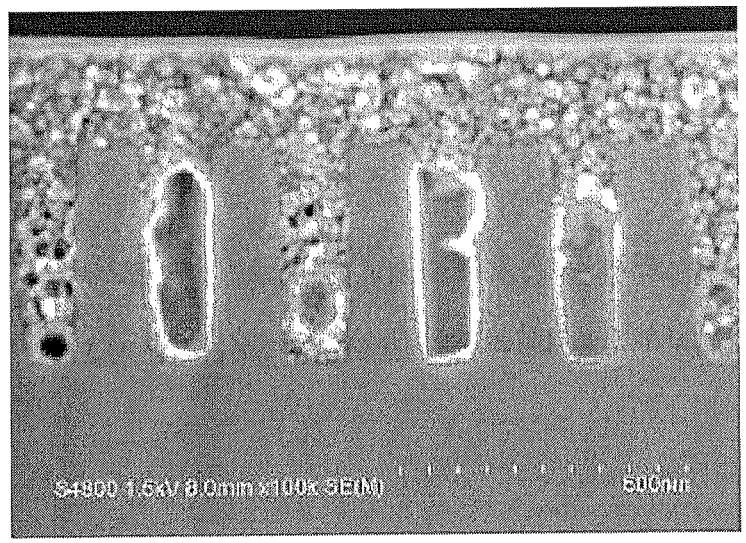
FIG. 5 is a photograph of a cross section of an upper surface part of a substrate which is formed by applying a solution of a resist underlayer film forming composition prepared in Comparative Example 1 onto a hole wafer substrate using a spin coater and baking the coating at 400° C. for 2 minutes and is observed by an electron microscope (100,000 magnifications).

The solution of the resist underlayer film forming compositions prepared in Comparative Example 2 was applied onto a hole wafer substrate using a spin coater and the applied coating was baked at 400° C. for 2 minutes. Thereafter, the obtained substrate was cut and observed with an electron microscope. Contrarily, from the observation photograph FIG. 5, it was found that cavities slightly existed in parts of the inside of the holes.

INDUSTRIAL APPLICABILITY

Different from a conventional high etch rate anti-reflective coating, the resist underlayer film material used for the lithography process of the multilayer film of the present invention can provides the resist underlayer film that has a selectivity of the dry etching rate close to that of the photoresist or smaller than the photoresist and a selectivity of the dry etching rate smaller than that of the semiconductor substrate and further also has the effect as the anti-reflective coating. It is found that the underlayer film material of the present invention has heat resistance of being able to form a hard mask on the underlayer film by vapor deposition.

The invention claimed is:

1. A resist underlayer film forming composition comprising:
a polymer having a unit structure of Formula (1):

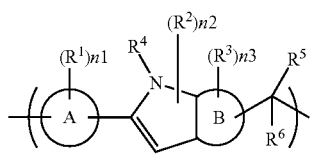

Formula (1)

(where $R^1$, $R^2$, and $R^3$ are substituents of hydrogen atoms on rings and are each independently a halogen group, a nitro group, an amino group, a hydroxy group, a $C_{1-10}$ alkyl group, a $C_{2-10}$ alkenyl group, a $C_{6-40}$ aryl group, or a combination of any of these groups that optionally includes an ether bond, a ketone bond, or an ester bond; $R^4$ is a hydrogen atom, a $C_{1-10}$ alkyl group, a $C_{2-10}$ alkenyl group, a $C_{6-40}$ aryl group, or a combination of any of these groups that optionally includes an ether bond, a ketone bond, or an ester bond; $R^5$ is a hydrogen atom, or a $C_{6-40}$ aryl group or a heterocyclic group that is optionally substituted with a halogen group, a nitro group, an amino group, a formyl group, a carboxy group, a carboxylic acid alkyl ester group, a phenyl group, a $C_{1-10}$ alkoxy group, or a hydroxy group; $R^6$ is a hydrogen atom, or a $C_{1-10}$ alkyl group, a $C_{6-40}$ aryl group, or a heterocyclic group that is optionally substituted with a halogen group, a nitro group, an amino group, a formyl group, a carboxy group, a carboxylic acid alkyl ester group, or a hydroxy group, or $R^5$ and $R^6$ optionally form a ring together with a carbon atom bonding to $R^5$ and $R^6$; a ring A and a ring B each are a benzene ring, a naphthalene ring, or an anthracene ring; n1, n2, and n3 each are an integer of 0 or more and up to a maximum number of substituents being able to be substituted in the ring).

2. The resist underlayer film forming composition according to claim 1, wherein
both of the ring A and the ring B are benzene rings,
n1, n2, and n3 are each 0, and
$R^4$ is a hydrogen atom.

3. The resist underlayer film forming composition according to claim 1, wherein
$R^5$ is a hydrogen atom, or a phenyl group, a naphthyl group, an anthryl group, or a pyrenyl group that is optionally substituted with a halogen group, a nitro group, an amino group, a formyl group, a carboxy group, a carboxylic acid alkyl ester group, a phenyl group, a $C_{1-10}$ alkoxy group, or a hydroxy group, and
$R^6$ is a hydrogen atom.

4. The resist underlayer film forming composition according to claim 1, further comprising a crosslinking agent.

5. The resist underlayer film forming composition according to claim 1, further comprising an acid and/or an acid generator.

6. A resist underlayer film obtained by applying the resist underlayer film forming composition as claimed in claim 1 onto a semiconductor substrate and baking the composition.

7. A method for producing a semiconductor device, the method comprising:
forming an underlayer film by use of the resist underlayer film forming composition as claimed in claim 1 onto a semiconductor substrate;
forming a resist film on the underlayer film;
forming a resist pattern by irradiation with light or an electron beam and development;
etching the underlayer film by use of the resist pattern; and
processing the semiconductor substrate by use of the patterned underlayer film.

8. A method for producing a semiconductor device, the method comprising:
forming an underlayer film by use of the resist underlayer film forming composition as claimed in claim 1 onto a semiconductor substrate;
forming a hard mask on the underlayer film;
forming a resist film on the hard mask;
forming a resist pattern by irradiation with light or an electron beam and development;
etching the hard mask by use of the resist pattern;
etching the underlayer film by use of the patterned hard mask; and
processing the semiconductor substrate by use of the patterned underlayer film.

* * * * *